United States Patent
Leite, Jr. et al.

(10) Patent No.: US 6,961,684 B2
(45) Date of Patent: Nov. 1, 2005

(54) EXTENSIBLE FRAMEWORK FOR CAPTURING FEATURE INFORMATION IN A NEUTRAL FORMAT

(75) Inventors: Aristides Goncalves Leite, Jr., Northville, MI (US); Glenn Matthew Poorman, Novi, MI (US)

(73) Assignee: Autodesk, Inc., San Rafael, CA (US)

( * ) Notice: Subject to any disclaimer, the term of this patent is extended or adjusted under 35 U.S.C. 154(b) by 391 days.

(21) Appl. No.: 09/859,115

(22) Filed: May 15, 2001

(65) Prior Publication Data

US 2001/0034596 A1 Oct. 25, 2001

Related U.S. Application Data

(63) Continuation of application No. 09/107,888, filed on Jun. 30, 1998, now Pat. No. 6,256,596.

(51) Int. Cl.[7] ............................................. G06F 17/50
(52) U.S. Cl. ............................ 703/2; 703/22; 702/14; 702/83; 345/427; 345/468; 345/681
(58) Field of Search ............................ 703/2, 22, 7, 1, 703/6; 702/14, 83; 345/427, 468, 681, 419, 420, 764, 634, 473, 769; 717/100

(56) References Cited

U.S. PATENT DOCUMENTS

| | | | |
|---|---|---|---|
| 4,951,231 A | | 8/1990 | Dickinson et al. |
| 5,297,241 A | * | 3/1994 | Hirr et al. .................... 345/427 |
| 5,307,490 A | | 4/1994 | Davidson et al. |
| 5,339,419 A | | 8/1994 | Chan et al. |
| 5,455,599 A | * | 10/1995 | Cabral et al. ............... 345/133 |
| 5,465,221 A | * | 11/1995 | Merat et al. .................. 702/83 |
| 5,519,818 A | * | 5/1996 | Peterson .................... 395/133 |
| 5,604,892 A | | 2/1997 | Nuttall et al. |
| 5,675,782 A | | 10/1997 | Montague et al. |
| 5,761,669 A | | 6/1998 | Montague et al. |
| 5,815,415 A | | 9/1998 | Bentley et al. |
| 5,842,213 A | | 11/1998 | Odom et al. |
| 5,905,989 A | | 5/1999 | Biggs |
| 5,911,074 A | | 6/1999 | Leprince et al. |
| 6,016,147 A | | 1/2000 | Gantt |
| 6,044,306 A | | 3/2000 | Shapiro et al. |
| 6,052,650 A | * | 4/2000 | Assa et al. .................... 702/14 |
| 6,124,864 A | | 9/2000 | Madden et al. |
| 6,131,097 A | | 10/2000 | Peurach et al. |
| 6,256,596 B1 | * | 7/2001 | Leite, Jr. et al. ................ 703/2 |
| 6,513,152 B1 | * | 1/2003 | Branson et al. ............. 717/100 |

* cited by examiner

*Primary Examiner*—Thai Phan
(74) *Attorney, Agent, or Firm*—Gates & Cooper LLP

(57) ABSTRACT

Flexible framework within a CAD application program is described that serves as a neutral format for feature information relating to modeling data for a solid body. The framework is hierarchical in nature to allow for ease of use and universal access to the design data. The hierarchical framework is independent of the underlying feature information as well as independent of the underlying CAD program.

15 Claims, 3 Drawing Sheets

EXTENSIBLE FRAMEWORK FOR CAPTURING FEATURE INFORMATION IN A NEUTRAL FORMAT

"This application is a Continuation of application Ser. No. 09/107,888, filed Jun. 30, 1988", entitled 'EXTENSIBLE FRAMEWORK FOR CAPTURING FEATURE INFORMATION IN A NEUTRAL FORMAT' which issued Jul. 3, 2001 as U.S. Pat. No. 6,256,596.

BACKGROUND OF THE INVENTION

1. Field of the Invention

The present invention relates generally to handling feature information in a parametric feature-based solid modeler, and in particular, to a method, apparatus, and article of manufacture for providing an extensible framework for capturing feature information in a neutral format for computer programs that build three d models based on form features.

2. Description of the Related Art

The use of Computer Aided Design (CAD) application programs is well known in the art. Some CAD programs provide standard objects that help users create documents, graphical presentations, etc. However, these standard objects provide only limited assistance and do little to help the user connect standard CAD components, define new components, or define methods of manipulating the components within the CAD program.

Further, most CAD programs have representations of objects that are unique to that CAD program. Each CAD designed part has features that are accessed by various people throughout the design and manufacturing process. However, designers, manufacturers, and users typically use different software programs with different formats to analyze and access the CAD data, creating confusion as well as incomplete data retrieval for all parties concerned.

Consequently, there is a need in the art for improved techniques to access CAD designed part data. Further, there is a need in the art for improved techniques for formatting the data such that the various parties that desire access to the CAD part data can obtain the information desired.

SUMMARY OF THE INVENTION

To address the requirements described above, the present invention discloses a method, apparatus, and article of manufacture for executing an extensible schema or framework for representing feature data in a computer, wherein the flexible framework provides data in a neutral format. The flexible framework serves as a database for users of multiple disciplines and multiple end products to access and use the CAD data.

All of the design intent represented in the feature model is accessible by the flexible framework in order to provide more capabilities to each user.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Figure 1:
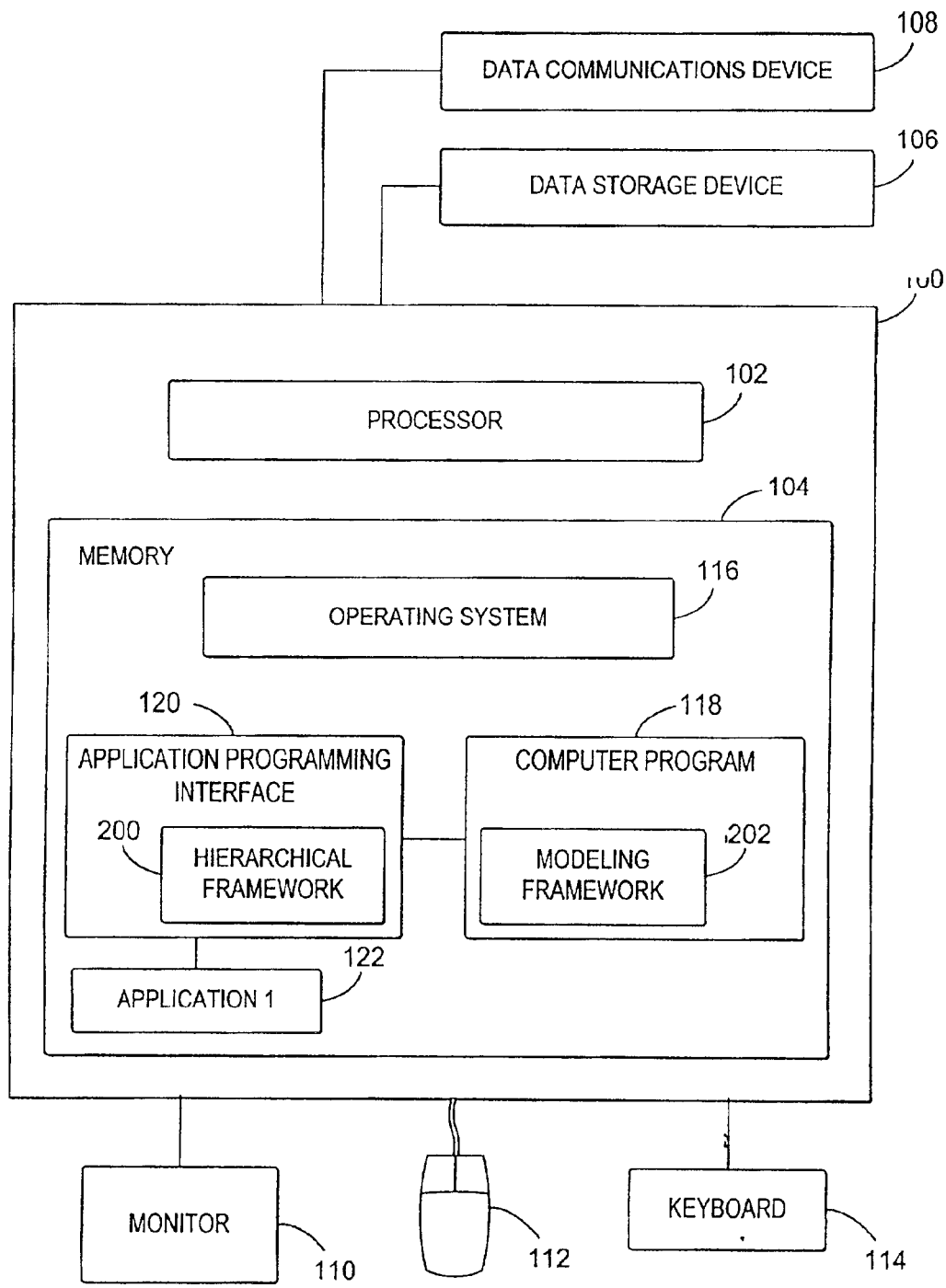
FIG. 1 is an exemplary hardware environment used to implement the preferred embodiment of the invention.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention is a Computer Aided Design (CAD) program that includes an Application Programming Interface (API) that allows for features in a parametric solid modeling system to be represented in a neutral, extensible format. The representation is independent of the particular underlying feature implementation. Enhancements to the underlying feature representations can be accomplished without impacting the user of the framework, thus supporting the development of systems which can evolve without compromising the binary compatibility of interacting applications.

The framework of the present invention allows information to be retrieved at different levels for optimal performance. It can be used for purposes of creating, querying, or editing features and can be seen as a representation-neutral language for the manipulation of features in parametric feature based solid modeling systems. The framework is particularly suitable for use in an API as it insulates the client of the API from internal details of the modeling system. It is applicable to any CAD program that supports built-in features in the context of a parametric feature based solid modeler. It defines a hierarchy of objects, and methods on these objects, which together contain all the information used in the creation and regeneration of any feature in the system. The information represented includes the type of feature, hierarchical characterization of the feature, the parameters driving how the feature is located and terminated on the part.

The basic classes used in the framework fall under the groupings of feature descriptors and feature informers. For each type of feature all defining parameters are properly represented. Feature informers are further subdivided into feature locators, feature terminators, and feature combiners. The following diagram illustrates how different classes in the framework are related. The framework can be easily extended to accommodate new types of features, different ways of locating features, etc.

The framework of the present invention allows for seamless transitions between developers of CAD drawings and other programs or users that need to access the parts that the CAD drawings represent. Each person that must access the drawing can access the information he or she wants because the framework allows for multiple levels of access.

Hardware Environment

FIG. 1 is an exemplary hardware environment used to implement the preferred embodiment of the invention. The present invention is typically implemented using a personal computer 100, which generally includes, inter alia, a processor 102, random access memory (RAM) 104, data storage devices 106 (e.g., hard, floppy, and/or CD-ROM disk drives, etc.), data communications devices 108 (e.g., modems, network interfaces, etc.), monitor 110 (e.g., CRT, LCD display, etc.), mouse pointing device 112 and keyboard 114. It is envisioned that attached to the personal computer 100 may be other devices such as read only memory (ROM), a video card, bus interface, printers, etc. Those skilled in the art will recognize that any combination of the above components, or any number of different components, peripherals, and other devices, may be used with the computer 100.

The personal computer 100 usually operates under the control of an operating system 116. One or more computer programs 118 that operate under the control of the operating system 116 are typically accessed via an Application Programming Interface (API) 120. Typically with the present invention, computer program 118 is a CAD program, but any program can implement the present invention. API 120 allows other programs and users to access computer program 118. Application 1 122 uses API 120 to interface and use computer program 118. Application 1 122 is representative of one or more applications or other interfaces that use API 120 to access computer program 118.

The API 120 provides a uniform referencing mechanism for all applications of the computer program 118. The API 120 allows application developers to refer to objects within the computer program 118 in a uniform manner without requiring the application to account for specific details of which application created the object referred to. For example, designer interface 126 can create an object to be used with computer program 118 through the API 120 that application 1 122 has access to and can use without conversion of the details of the representation of the object or details of the creation of the object being attached to the object created.

Within the computer program 118, a modeling framework 202 is used to represent the solid body that is being modeled. Within the API 120, the present invention adds a hierarchical framework 200 that converts or maps the modeling framework 202 to a framework that is easily accessed by application 1 122.

Generally, the computer program 118, API 120, application 1 122, hierarchical framework 200, and modeling framework 202 comprise instructions and/or data that are embodied in or retrievable from a computer-readable device, medium, or carrier, e.g., the data storage device 106, a remote device coupled to the computer 100 via the data communications device 108, etc. Moreover, these instructions and/or data, when read, executed, and/or interpreted by the computer 100 cause the computer 100 to perform the steps necessary to implement and/or use the present invention.

Thus, the present invention may be implemented as a method, apparatus, or article of manufacture using standard programming and/or engineering techniques to produce software, firmware, hardware, or any combination thereof. The term "article of manufacture" (or alternatively, "computer program product") as used herein is intended to encompass a computer program accessible from any computer-readable device, carrier, or media. Of course, those skilled in the art will recognize many modifications may be made to this configuration without departing from the scope of the present invention.

Those skilled in the art will recognize that any combination of the above components, or any number of different components, including computer programs, peripherals, and other devices, may be used to implement the present invention, so long as similar functions are performed thereby.

Modeling the Object

Figure 2:
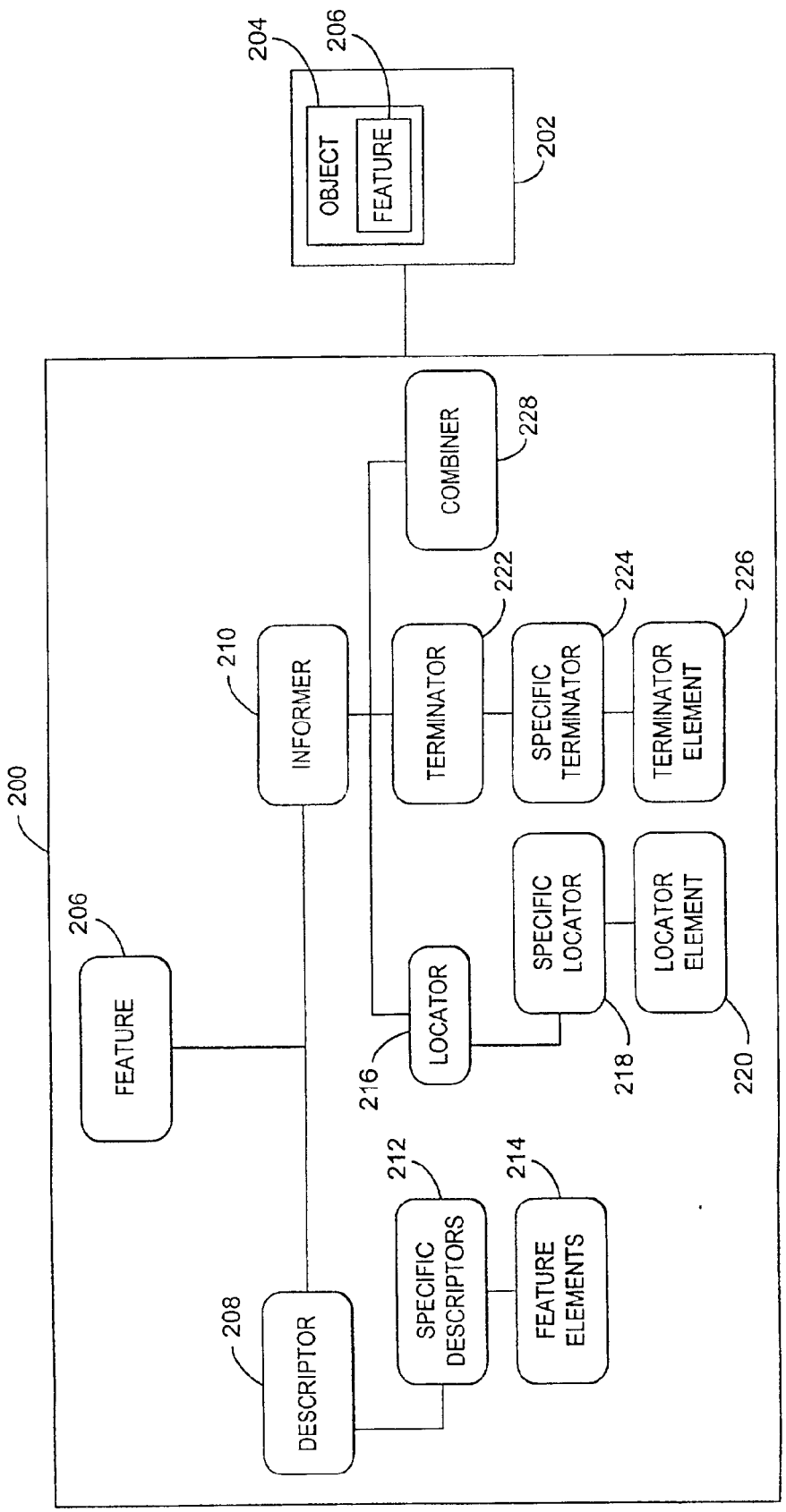
FIG. 2 illustrates relating to the hierarchical and modeling frameworks of the present invention.

FIG. 2 shows details relating to the hierarchical and modeling frameworks of the present invention. As application 1 122 creates a CAD drawing, computer program 118 is used as a modeling tool to parametrically model a solid body. Within the computer program 118, a modeling framework 202 is used to represent the solid body. Typically, the modeling framework 202 is object oriented, and contains object 204. Modeling framework 202 may contain more objects 204; one object 204 is shown for ease of presentation.

Located within each object 204 is a feature 206. A feature 206 may be a form feature, such as a hole, extrusion or fillet, or a work or datum feature, such as work axis or work plane. Further, object 204 can contain many features 206, and one feature 206 is illustrated for ease of presentation.

The hierarchical framework 200 of the present invention uses the information relating to the feature 206 of the modeling framework 202 and organizes it in a different manner. The hierarchical framework generates a neutral representation of the feature 206 and stores the neutral representation in defined classes to allow for ease of access to the information for purposes of query, creation, or editing.

As modeling of a solid body takes place, lines, geometric shapes, fillets, through and blind holes, and other qualities and features of the solid body are created that will be used for analysis and production later in the design process. As these features 206 are stored in an object-oriented sense in the modeling framework 202, the hierarchical framework 200 of the present invention provides the design data to application 1 122 through API 120 in a different format. The feature 206 is unchanged, but is now more readily accessible to application 1 122 on demand.

Hierarchical Framework

The hierarchical framework 200 of the present invention allows different applications to access CAD drawing information at different levels in a format that is not biased towards any of the potential applications, i.e., a "neutral" format. Each level of the hierarchical framework 200 is derived from the information stored in the level above itself.

As shown in FIG. 2, once application 1 122 is utilizing the computer program 118 to model the solid body, the framework 200 of the features 206 of the solid body is further broken down into descriptors 208 and informers 210. Descriptors 208 provide information on the data defining the shape of the feature 206, independent of the feature 206 location or termination. A specific descriptor 212, such as a hole descriptor or a fillet descriptor, is derived from a descriptor 208, and usually contains specific feature elements 214, such as the diameter of a circle, the length of a line, the angle that a line takes with respect to the horizontal or vertical axes, etc.

For example, a corner on an object is rarely exactly sharp; there is usually some rounding of the corner. There will be in the framework a specific feature element 214 that allows the application 1 122 to retrieve or specify values for the fillet radius. This specific feature element 214 (the radius) is accessed through a specific descriptor 212, in this case, a fillet descriptor. The descriptor 208 does not have a concrete instance within the hierarchical framework 200; instead, it is an abstract class that allows for uniform access to all specific descriptors 212. The hierarchical framework 200 can be extended into deeper levels if desired.

The informer 210 class allows the application 1 122 to specify information about the feature 206 that relate the feature 206 to external parameters. Locator 216, which is derived from informer 210, allows the application 1 122 to determine where the feature 206 will be placed on the drawing. Specific locator 218, such as a concentric locator or a co-linear locator, is derived from a locator 216, and usually contains locator elements 220, such as angles and distances.

For example, a hole can be placed on a modeled body concentrically with a cylindrical surface. Thus, the hierarchical framework 200 provides a specific locator 218, namely a concentric locator that corresponds to this type of hole location procedure. Using this specific locator 218, the user can query or set the hole position through the locator element 220, which represents a reference to the cylindrical surface in positioning the hole. The locator element 220 is accessed through the specific locator 218.

The locator 216 does not have a concrete instance within the hierarchical framework 200; instead, it is an abstract class that allows for uniform access to all specific locators 218. The hierarchical framework 200 can be extended into deeper levels if desired.

Specific locator 218 can also specify a relative location which allows the application 1 122 to determine where the feature 206 will be placed relative to another feature, whether tangent to, concentric with, aligned with, angled with respect to, or any other location information that draws on items external to the feature 206 itself.

Terminator 222 allows an application 1 122 to determine the termination characteristics of a feature 206. Terminator 222 allows for blind, through, planar, and from/to terminations, as well as other terminations of feature 206.

For example, a hole in a modeled body can have a certain depth, which is referred to as a blind hole. Thus, the hierarchical framework 200 provides a specific terminator 224 called a blind terminator. There will be in the hierarchical framework 200 a specific terminator element 226 which corresponds to the depth of the blind hole that allows application 1 122 to retrieve or specify values for the blind hole depth. This specific terminator element 226 (the depth) is accessed through a specific terminator 224, in this case, a blind terminator. The terminator 222 does not have a concrete instance within the hierarchical framework 200; instead, it is an abstract class that allows for uniform access to all specific terminators 224. The hierarchical framework 200 can be extended into deeper levels if desired.

Combiner 228 allows the application 1 122 to combine feature 206 with other features 206, whether joining, intersecting, cutting, basal, or other combinations.

The framework 200 can be easily extended to accommodate new types of features, different ways of locating features, etc. Further, additional classes, specific instances of classes, and features of the specific instances of each class are available for descriptor 208, informer 210, and any additional extended class that the framework is designed for.

As applications traverse the framework 200, applications can access the information stored in each class (descriptor 208 and informer 210) as well as each subclass (specific descriptor 212, feature descriptor elements 214, locator 216, specific locator 218, locator element 220, terminator 222, specific terminator 24, terminator element 226, and combiner 228) differently so each application can obtain the information they need to complete their task. Different levels of access can be given to allow some applications to only access class information, where other applications can be given full access to access any information within the framework 200. Further, some applications can be given read-only access to allow for limited entry access into the framework 200.

Flowchart

Figure 3:
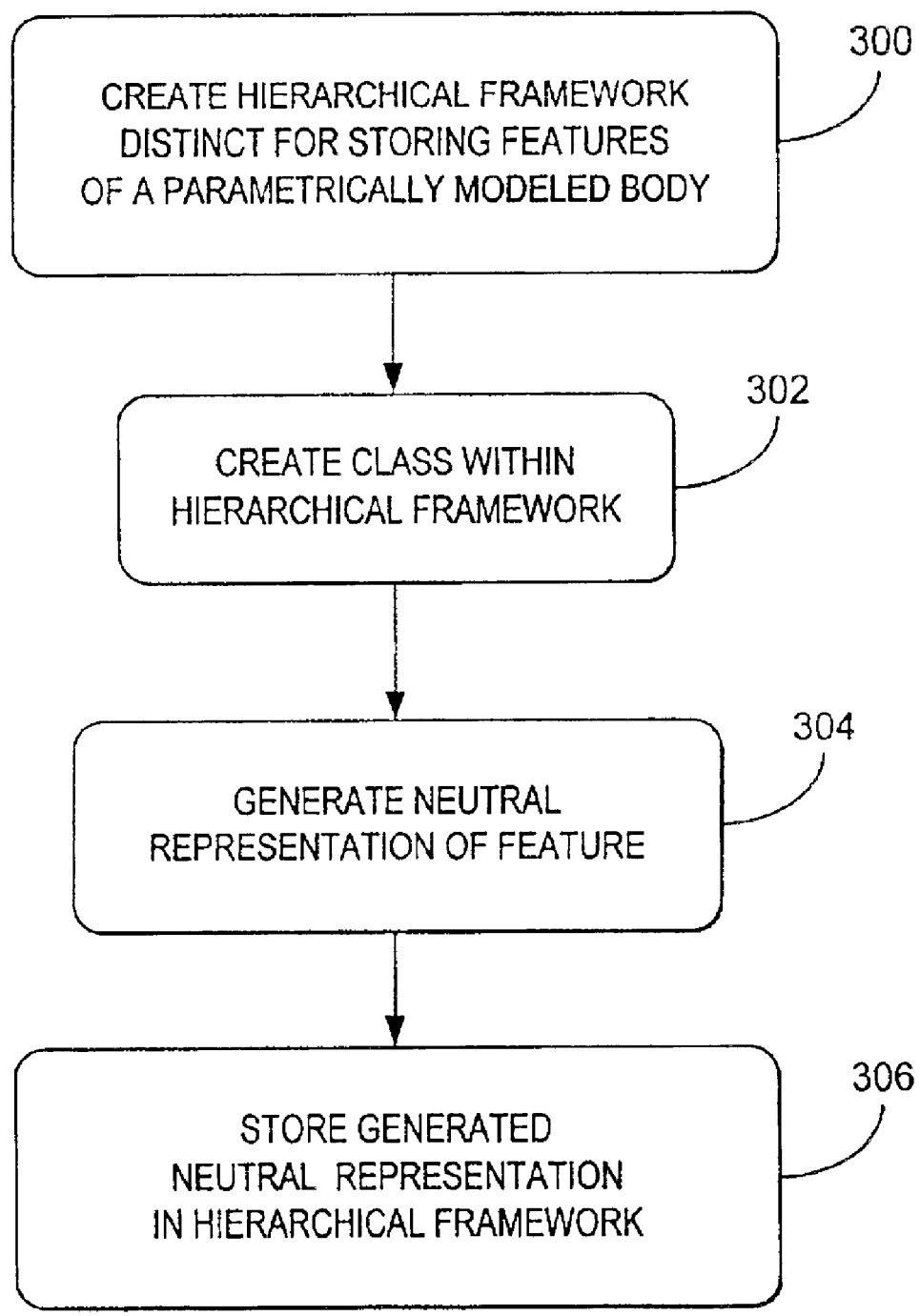
FIG. 3 is a flowchart that illustrates the general logic of performing the steps of the present invention.

FIG. 3 is a flowchart that illustrates the general logic of performing the steps of the present invention.

Block 300 represents performing the step of creating a hierarchical framework, the hierarchical framework distinct from the modeling framework.

Block 302 represents performing the step of creating at least one class within the hierarchical framework.

Block 304 represents performing the step of generating a neutral representation of the feature of the parametrically modeled solid body.

Block 306 represents performing the step of storing the neutral representation as an entry in the hierarchical framework.

CONCLUSION

This concludes the description of the preferred embodiment of the invention. The following describes some alternative embodiments for accomplishing the present invention.

For example, any type of computer, such as a mainframe, minicomputer, workstation or personal computer, could be used with the present invention. In addition, any software program, application or operating system having a user interface could benefit from the present invention.

The above teaching also supports additional functions that may also be implemented using the hierarchical framework of the present invention. In addition, the hierarchical framework can be integrated closely with each application program by any number of different methods.

In summary, the present invention discloses a method, apparatus, and article of manufacture for executing an extensible schema or framework for representing feature data in a computer, wherein the flexible framework provides data in a neutral format. The flexible framework serves as a database for users of multiple disciplines and multiple end products to access and use the CAD data. All of the properties of the modeled solid body are accessible by the flexible framework in order to provide more capabilities to each user.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of modeling a solid body in a computer-implemented parametric feature based solid modeling system, comprising:
   (a) modeling one or more solid bodies in a modeling framework as one or more objects within the computer-implemented parametric feature based solid modeling system, wherein each object comprises one or more features;
   (b) modeling each feature of each object into a hierarchical framework wherein each feature in the hierarchical framework includes one or more informers that specify how each feature relates to external parameters; and
   (c) accessing the one or more features of the modeling framework through an application programming interface (API) executed by the computer-implemented parametric feature based solid modeling system using the one or more informers in hierarchical framework.

2. The method of claim 1, wherein the one or more informers include one or more locators that determine how the feature of the object is placed in a drawing relative to a feature of another object.

3. The method of claim 2, wherein the locators include a relative location that determines where the feature of the object will be placed relative to the feature of another object.

4. The method of claim 1, wherein the one or more of informers include one or more terminators that determines termination points of a feature.

5. The method of claim 1, wherein the one or more informers include one or more combiners to combine the feature with features of another object.

6. A computer-implemented parametric feature based solid modeling system for modeling a solid body, comprising:

(a) means, performed by the computer-implemented system, for modeling one or more solid bodies within a modeling framework as one or more objects within the computer-implemented parametric feature based solid modeling system, wherein each object comprises one or more features;

(b) means, performed by he computer, for modeling each feature of each object into a hierarchical framework wherein each feature includes one or more informers that specify how each feature relates to external parameters; and (c) means, performed by the computer-implemented parametric feature based solid modeling system, for accessing the one or more features of the modeling framework through an application programming interface (API) executed by the computer-implemented parametric feature based solid modeling system using the one or more informers in the hierarchical framework.

7. The system of claim 6, wherein the one or more informers include one or more locators that determine how the feature of the object is placed in a drawing relative to a feature of another object.

8. The system of claim 7, wherein the locators include a relative location that determines where the feature of the object will be placed relative to the feature of another object.

9. The system of claim 6, wherein the one or more informers include one or more terminators that determines termination points of a feature.

10. The system of claim 6, wherein the one or more informers include one or more combiners to combine the feature with features of another object.

11. An article of manufacture embodying logic for modeling a solid body in a computer-implemented parametric feature based solid modeling system, the logic comprising:

(a) modeling one or more solid bodies within a modeling framework as one or more objects within the computer-implemented parametric feature based solid modeling system, wherein each object comprises one or more features;

(b) modeling each feature of each object into a hierarchical framework wherein each feature in the hierarchical framework includes one or more informers that specify how each feature relates to external parameters; and (c) accessing the one or more features of the modeling framework through an application programming interface (API) executed by the computer-implemented parametric feature based solid modeling system using the one or more informers in the hierarchical framework.

12. The article of manufacture of claim 11, wherein the one or more informers include one or more locators that determine how the feature of the object is placed in a drawing relative to a feature of another object.

13. The article of manufacture of claim 12, wherein the locators include a relative location that determines where the feature of the object will be placed relative to the feature of another object.

14. The article of manufacture of claim 11, wherein the one or more informers include one or more terminators that determines termination points of a feature.

15. The article of manufacture of claim 11, wherein the one or more informers include one or more combiners to combine the feature with features of another object.

* * * * *